United States Patent [19]

Tobias et al.

[11] Patent Number: 4,876,216
[45] Date of Patent: Oct. 24, 1989

[54] SEMICONDUCTOR INTEGRATED CIRCUIT MANUFACTURING PROCESS PROVIDING OXIDE-FILLED TRENCH ISOLATION OF CIRCUIT DEVICES

[75] Inventors: Eric Tobias; Chau-Shiong A. Chen, both of San Diego, Calif.

[73] Assignee: Applied Micro Circuits Corporation, San Diego, Calif.

[21] Appl. No.: 164,556

[22] Filed: Mar. 7, 1988

[51] Int. Cl.$^4$ ............................................ H01L 21/314
[52] U.S. Cl. ........................................ 437/67; 156/646
[58] Field of Search ..................... 437/67, 78; 156/646

[56] References Cited

U.S. PATENT DOCUMENTS

| | | | |
|---|---|---|---|
| 4,407,851 | 10/1983 | Kurosawa et al. | 427/39 |
| 4,455,740 | 6/1984 | Iwai | 437/67 |
| 4,543,706 | 10/1985 | Bencuya et al. | 437/67 |
| 4,740,480 | 4/1988 | Ooka | 437/61 |

FOREIGN PATENT DOCUMENTS

| | | | |
|---|---|---|---|
| 0039835 | 3/1985 | Japan | 437/67 |
| 0117753 | 6/1985 | Japan | 437/67 |

*Primary Examiner*—Olik Chaudhuri
*Attorney, Agent, or Firm*—Baker, Maxham, Jester & Meador

[57] ABSTRACT

In a method of semiconductor integrated circuit manufacture, a manufacturing process improvement provides highly planar, oxide-filled trench isolation of circuit device areas. The process improvement includes formation of a device area covered by a relatively thin insulating layer of oxide by a trenching process that forms a trench adjacent the device area. The thin insulating layer of oxide is extended over the side surface transition between the device area and the trench and then an insulating layer of crystalline dielectric material relatively thicker than the thin insulating layer is applied, which builds the trench at least to the level of the device area. A first layer of photoresist is applied over the thick insulating layer. The portion of the first photoresist layer overlying the device area is photolithographically removed, and then a second layer of photoresist is applied over the first layer; the second layer is applied to a thickness resulting in a relatively planar surface of photoresist overlying the trench and device area. All of the layers overlying the device area are removed by a process which operates toward the substrate surface on which the device area is formed. The removal process removes the first and second photoresist layers, the oxide of the relatively thin layer, and the crystalline dielectric material at substantially the same rate until the device area is expoded. When the device area is exposed, the removal process is terminated. The result provides a device area isolated by an oxide-filled trench, with the surface transition from the device area to the trench oxide being relatively planar.

5 Claims, 3 Drawing Sheets

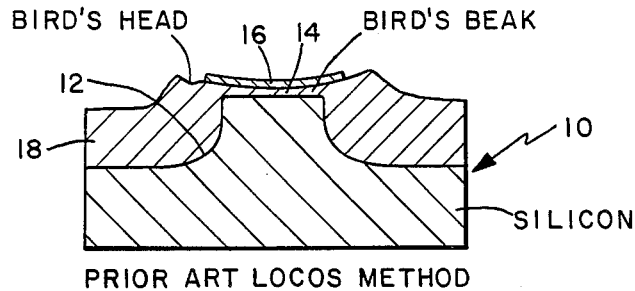
FIG. 1 PRIOR ART LOCOS METHOD
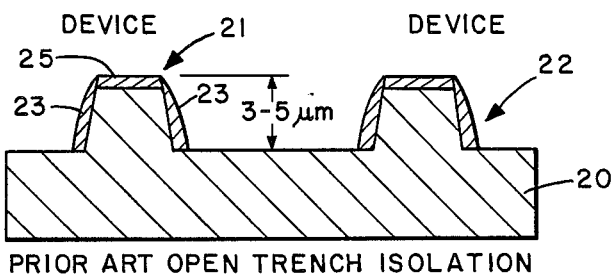
FIG. 2 PRIOR ART OPEN TRENCH ISOLATION
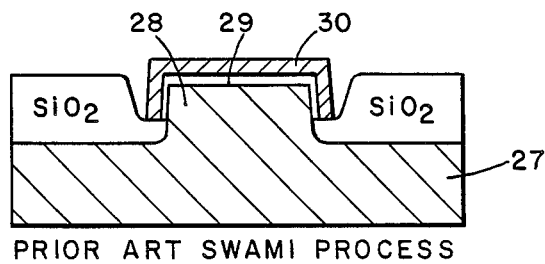
FIG. 3A PRIOR ART SWAMI PROCESS
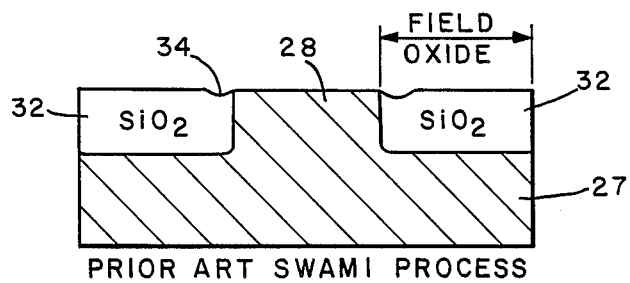
FIG. 3B PRIOR ART SWAMI PROCESS

SEMICONDUCTOR INTEGRATED CIRCUIT MANUFACTURING PROCESS PROVIDING OXIDE-FILLED TRENCH ISOLATION OF CIRCUIT DEVICES

The invention is in the field of integrated circuit manufacture in which circuit devices are isolated by an oxide-filled trench.

In integrated circuit manufacture, device isolation is a key parameter affecting circuit operation. Effective device isolation reduces parasitic effects such as conduction paths and capacitance that appear between the devices as an artifact of the manufacturing processes. The set of techniques useful for providing interdevice isolation in integrated circuit manufacture is traded off against other manufacturing requirements for surface planarity and minimization of device depth.

One method for providing device isolation is the well known LOCOS (localized oxidation of silicon) process. The primary attraction of the LOCOS process is that it is self-centering, in that it defines the device area by a step that provides a mask for the field oxidation step. Essentially the definition step consists of applying a mask of nitride over the device area. Nitride does not oxidize, and thus can prevent the oxidation of the device area, while permitting oxidation in the field area at the edges of the device area. This technique requires the application of a very thin layer of oxide between the nitride and the underlying semiconductor substrate. The thin oxide layer permits the field oxide to grow under (encroach) the edges of the nitride layer. This is illustrated in FIG. 1 where a semiconductor substrate 10 formed of silicon has been processed to define an active device area 12 by application of a thin layer of oxide 14 to the initially planar surface of the silicon substrate and an application of a nitride mask 16 which defines the active area. When the field oxide 18 is grown in the surface area of the substrate adjacent the mask 16, the field oxide growth encroaches under the edges of the mask 16 forming the well known bird's beak and bird's head topographical characteristics. Bird's beak encroachment reduces the effective device area, and results in residual stress at the edges of the device area. Although the LOCOS process is characterized as being a planar one, the bird's head artifact of the process results in a varying surface topography.

Another technique of interelement isolation is referred to as "trenching." Trenching divides into two techniques: open trenching and deep trenching. In open trenching, device areas are isolated by etching away the surface of the substrate between the device areas. This results in wide trenches having a depth of from 3 to 5 micrometers. Open trenching is illustrated in FIG. 2 where a semiconductor substrate 20 has two device areas 21 and 22 which are essentially raised surface portions separated by an open trench. Each device area comprises an oxide skirt 23 and an epitaxial layer 25 in which the device is formed. Open trench etching leaves 3 to 5 micrometers of vertical topography, which reduces the resolution of the photolithographic process.

Deep trench technology is best described by Wenocur et al. in J. Vac. Sci. Technol., A1, 2, April-June, 1983, pp. 719-720; Yamaguchi et al. in Proceedings of the IEDM '83, 1983, pp. 522-525; Kohyama et al., Proceedings of the IEDM '83, 1983, pp. 151-154; Kurosawa et al., U.S. Pat. No. 4,407,851; and See et al., U.S. Pat. No. 4,418,094. Deep trench isolation essentially consists of cutting a narrow groove (deep trench) to isolate device areas on a substrate. The trench dimensions must be relatively fixed; characteristically the trench is from 6 to 10 micrometers deep and 2 micrometers wide. The trench is filled with material such as implanted boron ions, polysilicon and silicon dioxide. The primary drawback of the deep trench process is the need to maintain precision in trench dimensions in order to ensure uniformity of the material deposited in it. The task is a difficult one which requires additional processing steps and results in a relatively high rejection rate for completed circuits.

One approach which combines LOCOS and trench technology is the SWAMI (side wall masked isolation) process described by Chiu et al. in *IEEE Transactions on Electron Devices*, Vol. ED-29, No. 4, April 1982, pp. 536-540. The process is illustrated in FIGS. 3A and 3B. The SWAMI process consists of open trench etching of the surface of a semiconductor substrate 27 to form a raised device area 28. Processing steps are employed to form a thin layer of silicon dioxide 29 which extends across the upper surface and partially down along the side walls of the raised device area 28. The oxide layer 29 acts as a stress relief layer between the substrate 27 and a covering layer of silicon nitride 30, which masks the device area during the growth of a field oxide at a relatively low temperature. A low temperature oxide (LTO) fills the trenches between the device areas. As shown in FIG. 3A, the silicon nitride film 30 extends over the device area upper surface and the side wall skirt of the thin oxide film 29. In the SWAMI process, the side wall skirts of the thin oxide and nitride films prevent the encroachment of the LTO under the nitride film into the upper device area surface. Once the LTO field oxide has grown, the nitride film 30 is stripped, and the resulting surface is planarized to a degree by a thin layer oxide growth followed by etch back of the thin layer and etch of the LTO. As shown in FIG. 3B, the device area 28 is isolated by a trench filled with low-temperature oxide 32 which acts as a field oxide to isolate the device 28 from other devices in the circuit. However, the SWAMI process involves many process steps, still leaves bird's head-like dips 34 in the field oxide adjacent the device area, and further provides no material or stress transition between the material of substrate 27 and the field oxide 32.

Therefore there is a need to further adapt the hydrid trench/field oxide isolation exemplified by the SWAMI method to provide a smoother surface after definition and isolation of device areas to permit precise photolithographic definition of devices. Further, there is an evident need in the process for a material and stress transition between the field oxide which fills the trenches and the material of the underlying semiconductor substrate.

SUMMARY OF THE INVENTION

The invention is founded on the critical observations that planarity of a hydrid trench/oxide isolation technique can be enhanced by recently-reported methods of device planarization, and that a thin oxide layer extending over the device area, the side walls, and the area of the trench provides satisfactory material in stress transition between dissimilar materials.

The invention is realized in a process for manufacturing an integrated circuit device on a semiconductor substrate. The invention consists of an improvement to the process, the improvement resulting in the isolation of individual circuit areas by oxide-filled trenches. The invention is expressed as a method including a first step of forming a device area with an upper surface on a surface of a semiconductor substrate by a trenching process which forms an open trench adjacent to the device area. Next, a relatively thin insulating layer of silicon dioxide is formed on the substrate surface from the device area, over the side wall surface between the device area and the trench floor, and over the surface of the trench floor. Then, an insulating layer of crystalline dielectric material is applied over the extended thin insulating layer. The layer of crystalline dielectric material is relatively thicker than the thin insulating layer and fills the trench at least to the level of the device area upper surface. A first layer of photoresist is then applied over the wafer surface. The portion of the first photoresist layer overlying the device area is then developed using standard lithographic techniques. After removal of the developed areas of the first photoresist layer, a second layer of photoresist material is applied over the wafer surface. Finally, the second and first photoresist layers and the thicker insulating layer are removed by means of an "etch-back" process which is directed substantially toward the substrate surface from the second layer and which removes the photoresist of the first and second layers, the oxide of the relatively thin layer, and the crystalline dielectric material at substantially the same rate. The removal process is halted when the device area is exposed.

The primary objective of this invention is to provide a process for isolating integrated circuit elements by means of an oxide-filled trench with relatively smooth topographic features.

A further objective is to provide such a process which eliminates bird's beak encroachment and bird's head topographical variations.

A significant advantage of the invention is the realization of a process providing oxide-filled trench isolation of semiconductor circuit devices in which the material and stress transition between the substrate material and the trench oxide are relatively smooth.

These and other objectives and advantages will be manifest when the detailed description of this novel process is read with reference to the below-described drawings.

BRIEF DESCRIPTION OF THE DRAWINGS

FIGS. 1, 2, and 3A–3B are side sectional views showing selected aspects of three respective prior art integrated circuit manufacturing processes.

DETAILED DESCRIPTION OF THE PREFERRED EMBODIMENT

The present invention is concerned with the manufacture of integrated circuits (IC) on semiconductor substrates by processes including photolithography, material deposition, thin and thick film growth, and material etching. Although described in terms of well-known silicon technology, it is contemplated that the technique of the invention would be transferrable to other material technologies.

Figure 4A:
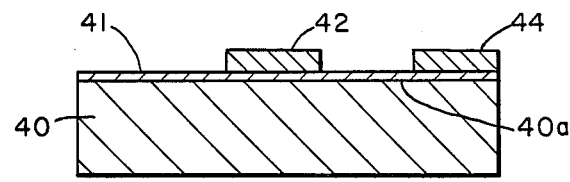
FIGS. 4A–4F are side sectional views of a device area formed on a semiconductor substrate and illusrate a sequence of steps included in the practice of the invention.
Figure 4B:
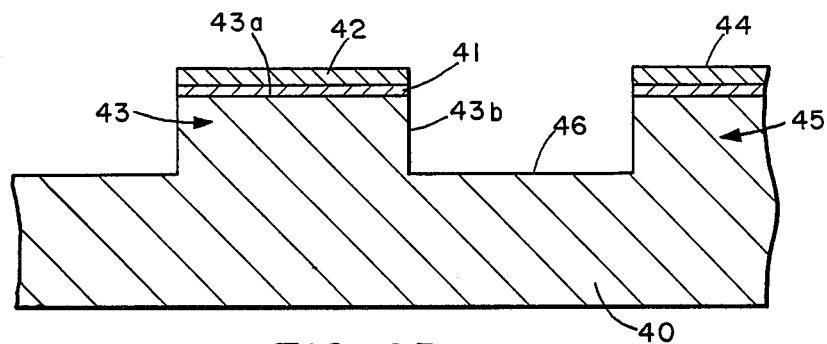

Referring now to FIG. 4A and 4B, a silicon semiconductor substrate 40 is to have formed thereon a pair of device areas 43 and 45. The device areas are separated by a trench having a depth of approximately one micrometer. The device areas are formed on the surface of the substrate using a conventional photolithographic technique. In this regard, the semiconductor substrate 40 has formed on an upper surface 40a a relatively thin film of silicon dioxide "oxide film 41." The thin oxide film 41 has thickness of approximately 300 angstroms and is grown uniformly over the surface 40a. A photoresist layer is formed into masks 42 and 44 by a standard photolithographic process which leaves photoresist masks 42 and 44 to act as shields for device areas 43 and 45 wherein semiconductor devices are to be formed during later process steps. The photoresist masks 42 and 44 mask the portion of the substrate 40 over which they lie against a trenching process consisting of an etching step which removes the portion of the thin layer 41 and a portion of the underlying substrate not masked by photoresist. The trenching step is permitted to proceed until approximately one micrometer of substrate material has been removed. The result of the trenching process is illustrated in FIG. 4B.

In FIG. 4B, the two device areas 43 and 45 underlying the masks 42 and 44, respectively, are separated by a trench having a depth of approximately one micrometer. The device area 43 includes an upper planar surface 43a and a side wall 43b which transitions between the upper surface 43a and the surface 46 of the trench separating the device areas 43 and 45. Any remnants of photoresist mask 42 and thin oxide layer 41 are removed after the formation of the trench.

Figure 4C:
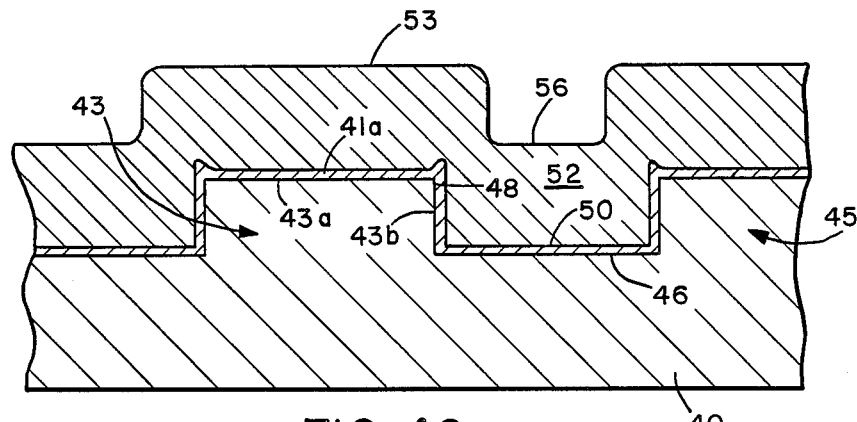

Referring now to FIG. 4C, the thin oxide layer 41a is grown on the active device surface 43a, the side wall 43b of the device area and the surface 46 of the trench. The portion of the thin oxide layer extension covering the device area side wall is indicated by 48, while the portion covering the surface of the trench is indicated by 50. Next, a dielectric layer of field material is deposited over the substrate. The field material includes a crystalline dielectric material such as a low-temperature oxide (LTO) deposited by the well known low pressure chemical vapor deposition (LPCVD) process. Alternatively, the material can consist of any material which can be deposited by LPCVD techniques. The dielectric layer is indicated by reference numeral 52. The dielectric layer 52 is relatively thicker than the extended thin oxide layer 41a, 48, 50. The dielectric layer 52 is grown to a thickness of approximately 15,000 angstroms. As shown in FIG. 4C, the topography of the dielectric layer 52 mimics the topography of the underlying structure over which it is deposited. Thus, there is a distinct dielectric mesa 53 which overlies the device area 43. The remainder of the process of the invention involves removal of this mesa 53 in such a manner as to leave a relatively planar surface which transitions from the device area upper surface 43a to the surface of the relatively thick dielectric layer 52.

Prior to planarization of the topography illustrated in FIG. 4C, it is assumed that the dielectric consists of LTO. After deposition of the layer 52, the LTO is densified by a thermal furnace anneal at 750° C., in a relatively dry, inert ambient atmosphere which discourages further oxidation. The densification essentially matches the material characteristics of the LTO to those of the thin oxide layer 41, 48, 50.

Figure 4D:
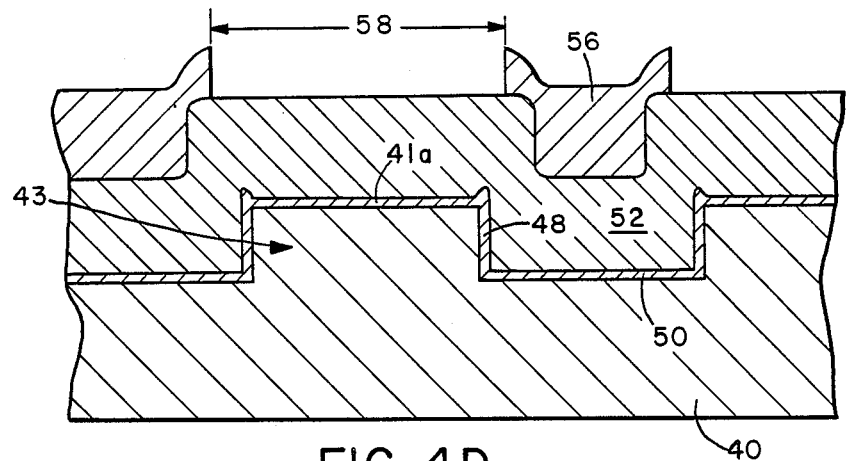

Referring now to FIG. 4D, a two-layer planarization process is employed to achieve the desired uniform topography transistion from the device area upper surface to the dielectric. The two-layer planarization process can be understood by reference to Schiltz et al., *Journal of the Electrochemical Society: Solid-State Science and Technology*, Vol. 133, No. 1, January 1986, pp. 178-181. Essentially the process consists of applying a relatively thin first layer 56 of photoresist material (R1). The thin photoresist layer is masked, and developed and removed in a reverse tone isolation masking step. The masking step results in removal of the portion of the first resist layer 56 overlying the device area 43. This portion is indicated by 58 in FIG. 4D. After the masking step, the remainder of the thin resist layer 56 is baked at approximately 200° C. to harden the resist and prevent it from merging into the next layer of photoresist to be applied. As a result of the hardening, the layer 56 is planarized by reflow of the resist to a certain extent and hardened to a point where it will not dissolve when the next layer of resist material is applied.

Figure 4E:
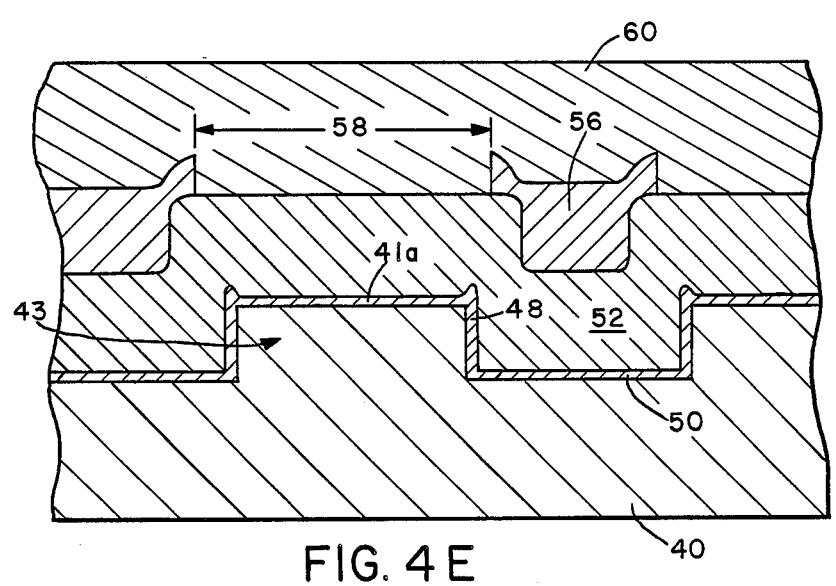

Referring now to FIG. 4E, a second, relatively thick layer 60 of resist material (R2) is applied overall. The thick resist layer 60 fills the voids in the thin resist layer such as the opening 58 over the device area 43. Further, the thickness of the second layer 60 depends upon the deviation from planarity of the first layer 56; that is, the more the surface of the thin resist layer varies, the thicker must be the second resist layer in order to make it planar. Once the second layer is applied, it is hardened and reflowed by baking at a temperature of approximately 200° C. The resist materials R1 and R2 can also be any well-known organic mateiral which is applied over processed semiconductor substrates by a spin-on process.

Figure 4F:
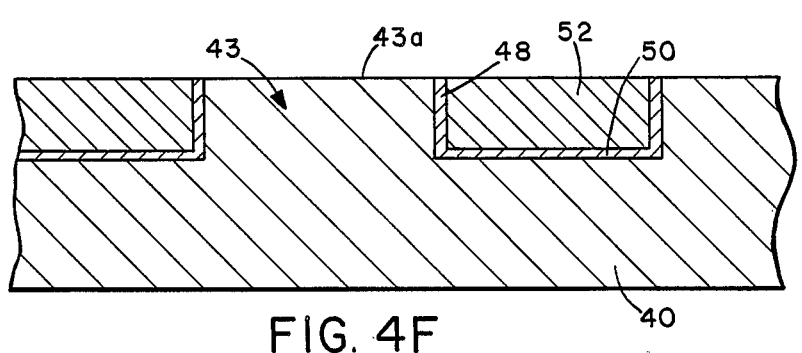

Following hardening, the thick resist layer 60 exhibits a surface which is relatively smooth. The relative planarity of the upper surface of the layer 60 provides an excellent reference for an etch-back process directed toward the surface of the substrate 40. The etch-back process employed is one which removes the resist materials R1 and R2, the material of the thick dielectric layer 52 and the material of the thin oxide layer 41, 48, 50, at substantially the same rate. The inventors have employed for this purpose a combination of freon and oxygen in a ratio which permits the oxygen to etch the photoresist materials R1 and R2 at the same rate as the freon etches the oxides of the layers 52 and 41. For this purpose, the inventors utilized 50 SCCM (Standard CC's/Min.) of freon together with 40 SCCM of oxygen within an 8110 reactor available from AME. The etch-back step is permitted to continue, removing the resist layers 60 and 56 at the same rate as the layers 52 is removed. The process proceeds until the thin oxide layer 41a is exposed. The progress of the etching step can be monitored by optical techniques which monitor the chemistry of the etching step by-products. When the presence of by-products from the thin layer 41a is detected, the etch-back step is terminated. Next, the device is dipped in dilute hydrofluoric acid having a strength suitable for etching approximately 1,000 angstroms per minute of oxide. The dip is timed for removal of the thin layer 41a. The result is illustrated in FIG. 4F where the device area upper surface 43a is shown to be substantially planar with the upper surface of the dielectric layer 52. As shown in FIG. 4F, the device area 43 is isolated by an oxide-filled trench wherein the oxide consists of the dielectric layer 52. Moreover, the transition between the dielectric material 52 and the material of the substrate 40 is enhanced by the thin oxide layer remnant 48, 50. The surface of the processed substrate of FIG. 4F is substantially planar, permitting the device fabrication process to proceed with formation of a device in the area 43.

It should be evident that the trench oxide isolation resulting from the practice of the invention essentially eliminates the bird's beak encroachment and minimizes topography variations which result from, for example, trench definition and bird's head variations. This leave an extremely flat topography which is ideal for high density, high speed circuit fabrication. The thin oxide layer sections 48, 50 provide stress and material transition between the field oxide material in between the field oxide material in the trench and the underlying substrate material. Since the oxide layer 52 can be constructed from crystalline materials grown under low temperature conditions, the thermal cycling required for trench oxide isolation fabrication according to the invention is substantially less than that experienced in the LOCOS process. Therefore, the process of the invention is extremely suitable for state-of-the-art shallow junction device fabrication.

Obviously, those skilled in the art will realize that the present invention affords a wide range of equivalents.

We claim:

1. In a process for manufacturing an integrated circuit device on a semiconductor substrate, an improvement for isolating individual circuit elements in said device, comprising the steps of:
    forming a device area having an upper surface on a surface of said substrate by a trenching process which forms a trench adjacent said device area, said trench having a side surface which extends to said device area;
    forming a relatively thin insulating layer of oxide covering said device area upper surface, said trench side surface and the floor surface of said trench;
    applying, over said thin insulating layer, an insulating layer of crystalline dielectric material which is relatively thicker than said thin insulating layer and which fills said trench at least to the level of said device area upper surface;
    applying a first layer of photoresist over said thicker insulating layer and photolithographically removing the portion of said first layer which overlies said device area;
    applying a relatively planar second layer of photoresist over said first layer of photoresist; and
    removing said second layer, said first layer and said relatively thicker insulating layer by means of a removal process in which removal proceeds toward said substrate surface from said second layer and which removes the photoresists of said first and second layers, the oxide of said relatively thin layer and the crystalline dielectric material at substantially the same removal rate, and ceasing said removing when said removal process has progressed to the point at which the level of said device area is reached and said device area is exposed.

2. The method of claim 1 wherein said trench has a depth of substantially 1 micrometer.

3. The method of claim 1 wherein said relatively thin layer of oxide is from 300 angstroms to 1000 angstroms thick.

4. The method of claim 3 wherein said relatively thin layer is silicon dioxide.

5. The method of claim 1 wherein said first and second photoresist layers comprise an organic resist material.

* * * * *